US006169397B1

(12) United States Patent
Steinbach et al.

(10) Patent No.: US 6,169,397 B1
(45) Date of Patent: Jan. 2, 2001

(54) DAMPED SUPERCONDUCTING COIL SYSTEM HAVING A MULTITURN, PLANAR GEOMETRY SUPERCONDUCTING COIL AND SHUNT RESISTORS ELECTRICALLY CONNECTING SUCCESSIVE COIL TURNS

(75) Inventors: Andrew Harvey Steinbach, Paris (FR); Martin Emile Huber, Louisville; Ronald Hajime Ono, Boulder, both of CO (US)

(73) Assignees: University Technology Corp., Boulder, CO (US); National Institute of Standards and Technology, Gaithersburg, MD (US)

( * ) Notice: Under 35 U.S.C. 154(b), the term of this patent shall be extended for 0 days.

(21) Appl. No.: 09/133,470

(22) Filed: Aug. 13, 1998

Related U.S. Application Data

(60) Provisional application No. 60/055,564, filed on Aug. 13, 1997.

(51) Int. Cl.[7] .................. G01R 33/02; G01R 33/035; H01L 21/00; H01L 39/22
(52) U.S. Cl. ............................ 324/248; 505/846
(58) Field of Search .................... 324/248–244; 505/845, 846–874; 327/527, 528; 257/31

(56) References Cited

U.S. PATENT DOCUMENTS

| 5,319,307 | 6/1994 | Simmonds | 324/248 |
|---|---|---|---|
| 5,656,937 | 8/1997 | Cantor | 324/248 |

OTHER PUBLICATIONS

Keene, Mark, Nicholas Exon, Julian Satchell, Richard Humphreys, Nigel Chew and Karan Lander, "HTS SQUID Magnetometers with Intermediate Flux Transformers," IEEE Transactions on Applied Superconductivity, 1996.

Cantor, Robin, "DC SQUIDS: Design, Optimization and Practical Applications," *SQUID Sensors: Fundamentals, Fabrication and Applications*, H. Weinstock (ed.), Netherlands: Kluwer Academic Publishers, 1996, pp. 179–233.

Ryhanen, Tapani, Heikki Seppa, Risto Ilmoniemi, and Jukka Knuutila, "Squid Magnetometers for Low–Frequency Applications," Journal of Low Temperature Physics, vol.76, Nos. 5/6, 1989, 287–386.

Enpuku, K., R. Cantor and H. Koch, "Resonant Properties of a DC SQUID Coupled to a Multiturn Input Coil," IEEE Transactions on Applied Superconductivity, vol. 3, No.1, 1993, 1858–1861.

Enpuku, K., K. Yoshida and S. Kohjiro, "Noise Characteristics of a DC SQUID with a Resistively Shunted Inductance," J. Appl. Phys., vol. 60, No. 12, 1986, 4218–4223.

Sauvageau, J.E., C.J. Burroughs, P.A.A. Booi, M.W. Cromar, S.P. Benz and J.A. Koch, "Superconducting Integrated Circuit Fabrication with Low Temperature ECR–Based PECVD $SiO_2$ Dialectic Films," IEEE Transactions on Applied Superconductivity, vol. 5, No. 2, 1995, 2303–2309.

Ketchen, M.B., "DC SQUIDS 1980: The State of the Art," IEEE Transactions on Magnetics, vol. 17, No. 1, 1981, 387–394.

Jaycox, J.M., and M.B. Ketchen, "Planar Coupling Scheme for Ultra Low Noise DC SQUIDs," IEEE Transactions on Magnetics, vol. 17, No. 1, 1981, 400–403.

*Primary Examiner*—Jay Patidar
(74) *Attorney, Agent, or Firm*—Jennifer L. Bales; Macheledt Bales & Johnson LLP

(57) ABSTRACT

The operation of a planar geometry superconducting coil used in conjunction with a ground plane is improved by intracoil damping. This damping reduces coil resonances. The improvement consists of an intracoil shunt, which damps the resonances of the coil by connecting each turn, or loop, of the multiturn/multiloop coil with resistors. One example of a planar geometry superconducting coil which is effectively damped according to the present invention is the input coil to a superconducting quantum interference device (SQUID). The intracoil shunt may be added to the SQUID at the same time in the SQUID fabrication as the junction shunts.

24 Claims, 10 Drawing Sheets

DAMPED SUPERCONDUCTING COIL SYSTEM HAVING A MULTITURN, PLANAR GEOMETRY SUPERCONDUCTING COIL AND SHUNT RESISTORS ELECTRICALLY CONNECTING SUCCESSIVE COIL TURNS

This application claims the benefit of U.S. Provisional Pat. Application No. 60/055,564 entitled, APPARATUS AND METHODS FOR DAMPING COIL RESONANCES IN PLANAR GEOMETRY SQUIDs, filed on Aug. 13, 1997.

This invention was made with Government support awarded by the National Insitute of Standards and Technology under Grant Number 40RNB7B0040. The Government may have certain rights in this invention.

BACKGROUND OF THE INVENTION

1. Field of the Invention

The present invention relates to planar geometry, multiturn superconducting coils used with a ground plane, and more particularly to apparatus and methods for reducing resonances in such coils.

2. Description of the Prior Art

One of the basic circuit elements of superconducting electronic devices is the inductor. In order to obtain useful values of inductance, multiple windings, or turns, of the inductor coil are often required. Moreover, a basic method of fabricating superconducting electronic devices is thin film deposition and patterning, resulting in the widespread use of planar geometry spiral inductors in practical circuit design. Such nominally spiral coils may be of any symmetry (square, circular, octagonal, etc.). In those situations where planar spiral inductor coils are implemented in conjunction with a ground plane (particularly a superconducting ground plane), stray capacitance between the coil and the ground plane results in an inductive/capacitive resonant circuit with very low damping ("high Q"). Resonance induced changes in the impedance of either the coil or the ground plane at the resonance frequency or frequencies often unfavorably influence the operation of devices incorporating either of the two elements, and therefore damping of these resonances is desirable. The most common (though not exclusive) example of this situation is the input coil to a superconducting quantum interference device (SQUID).

Current technology for SQUID fabrication uses a planar fabrication process to create a washer geometry ground plane whose purpose is to focus magnetic flux from an input inductor or coil to the SQUID body; the ground plane often in fact forms the SQUID body. This geometry was developed by Jaycox and Ketchen (see, for example, "Planar coupling scheme for ultra low noise dc SQUIDS," J. M. Jaycox and M. B. Ketchen, IEEE Trans. Magn., vol. MAG-17, pp. 400–403, January 1981). This geometry results in an inductive-capacitive resonant circuit as discussed above. The resulting resonances distort the output characteristics of the SQUID and introduce electronic noise. Both of these consequences degrade SQUID performance.

FIGS. 1 and 2 (prior art) show a conventional planar SQUID 100, including a multiturn input coil 104 which couples external signals to the SQUID via SQUID washer 102. FIG. 1 is a simplified top view of the device, while FIG. 2 is a schematic. A conventional dc SQUID 100 is formed with a loop of superconducting material (washer 102) interrupted by two Josephson tunnel junctions 106. Josephson junctions 106 are shunted with resistors 112 to remove hysteresis as necessary. In operation, SQUID 100 is biased with a constant current, $I_b$ 130. When a current, $i_f$ 126 passes through input coil 104, it causes a magnetic field which modifies the current flow in washer 102, resulting in a change in the voltage across Josephson junctions 106 and the SQUID as a whole. Thus, the measured voltage (V) 124 across the SQUID is related in a predictable way to the current flowing in coil 104, and can be used to determine the current flowing in coil 104. This voltage can be measured by external circuitry.

However, high frequency currents which develop within Josephson junctions 106 cause resonances to develop in coil 104, which cause voltage 124 to lock onto certain values, causing the relation between the value of current 126 introduced into coil 104 to become nonlinear. As a result of the nonlinearity, the SQUID is not as useful as it could be.

Techniques in the prior art which have been used to reduce the effects of resonances have met with limited success. Returning to FIG. 1, these include an external coil shunt 108, a washer shunt 110, overdamped junction shunts 112, and/or coil/washer shunt 114. In the cases of external coil shunt 108, washer shunt 110, and coil/washer shunt 114, both resistive and resistive/capacitive networks have served as the shunting element.

All of the previous methods of damping resonances in planar geometry superconducting coils have attempted to damp the resonance of the coil as a whole. A need remains in the art for improved apparatus and methods for damping resonances in planar geometry superconducting coils.

SUMMARY

It is an object of the present invention to provide improved apparatus and methods for damping resonances in planar geometry superconducting coils. In order to meet this object, an internal damping resistor is applied across the windings of the coil. Thus resistive damping is added to each turn of the coil.

A damped superconductor coil according to the present invention comprises a planar geometry multiturn superconducting coil and an intracoil shunt connecting a plurality of turns of the coil with resistors.

An electrical ground plane is disposed parallel and proximate to the coil. Generally, the electrical ground plane consists of a superconductive material and forms at least one hole, which concentrates magnetic field lines from the coil to the hole. The ground plane may also form a gap extending from the hole to the edge of the ground plane to admit changing magnetic flux.

The coil may comprise a signal coil or a modulation coil of a superconducting quantum interference device (SQUID), an inductor in a filter, or a winding in a transformer.

The shunt may comprise a planar-film resistor which extends along a radius of the coil, or along more than one radius of the coil.

DETAILED DESCRIPTION OF THE PREFERRED EMBODIMENT

Figure 3:
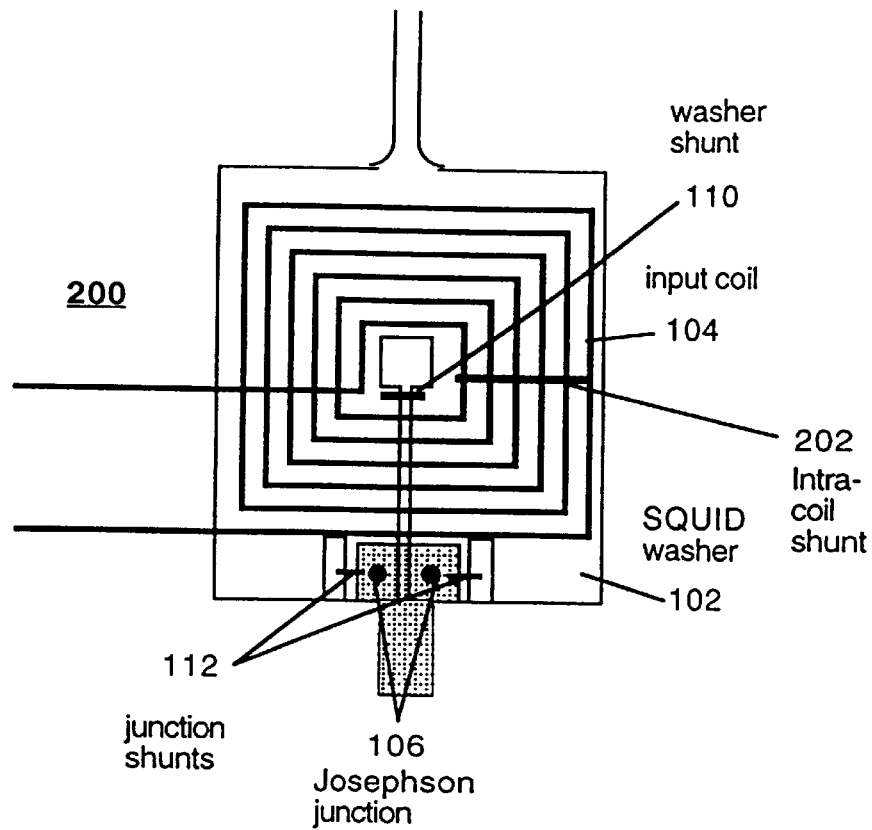
FIG. 3 shows a planar geometry coupled dc SQUID having improved coil damping, according to the present invention.
Figure 4:
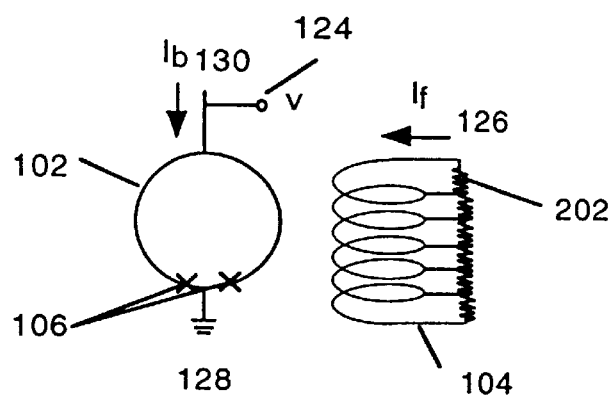
FIG. 4 shows a schematic diagram of the planar geometry coupled SQUID having improved coil damping of FIG. 3.

FIG. 3 shows a planar geometry coupled dc SQUID 200 having improved coil damping, according to the present invention. FIG. 4 shows a simplified schematic diagram of SQUID 200 of FIG. 3. Improved SQUID 200 includes intercoil shunt 202, which damps the resonances of coil 104 by connecting the coil turns or loops with resistors. Like conventional SQUID 100 of FIG. 1, improved SQUID 200 is used to determine the current in coil 104 by measuring the voltage across the SQUID. Washer shunt 110 may still used. Junction shunts 112 are still present to remove hysteresis from Josephson junctions 106, but the damping they provide need not be as severe as in the absence of intracoil damping.

Figure 5:
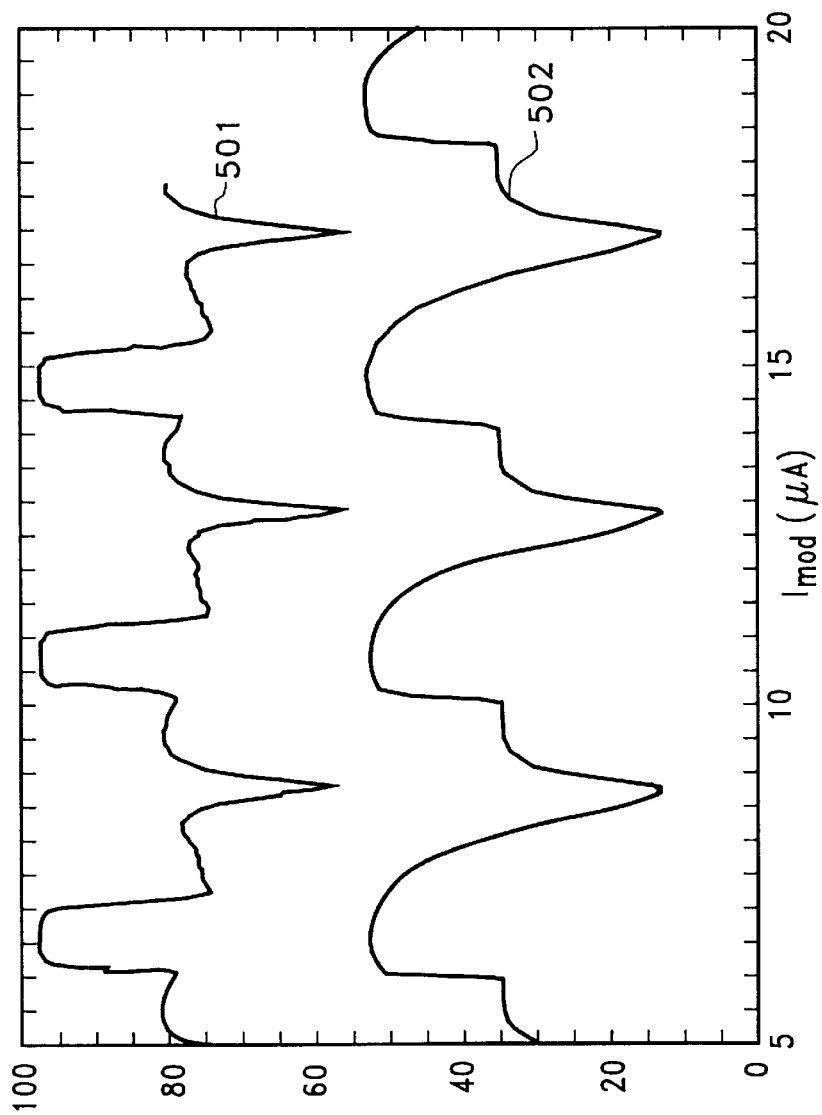
FIG. 5 shows voltage-flux curves for the conventional SQUID of FIG. 1 and the improved SQUID of FIG. 3.
Figure 6:
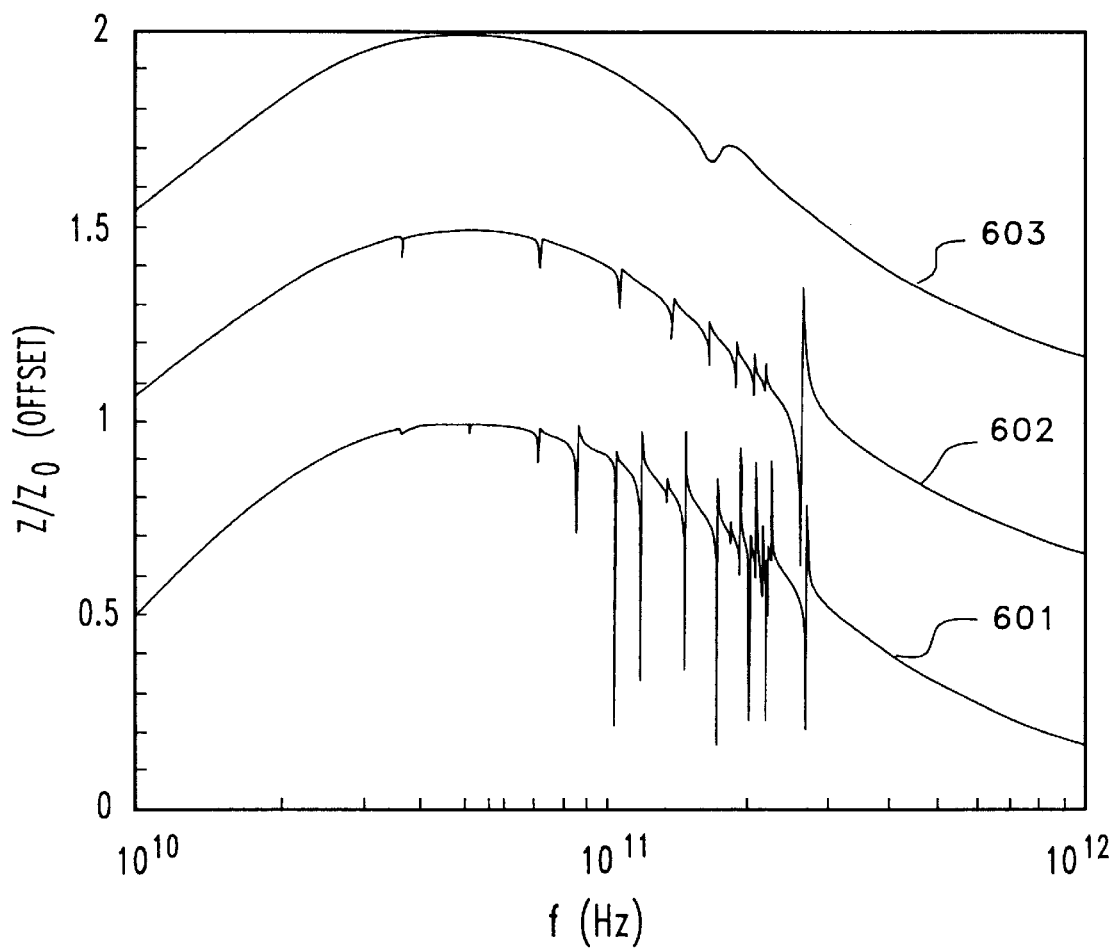
FIG. 6 shows the calculated impedance of the conventional SQUID of FIG. 1 and the improved SQUID of FIG. 3 as a function of frequency.
Figure 7:
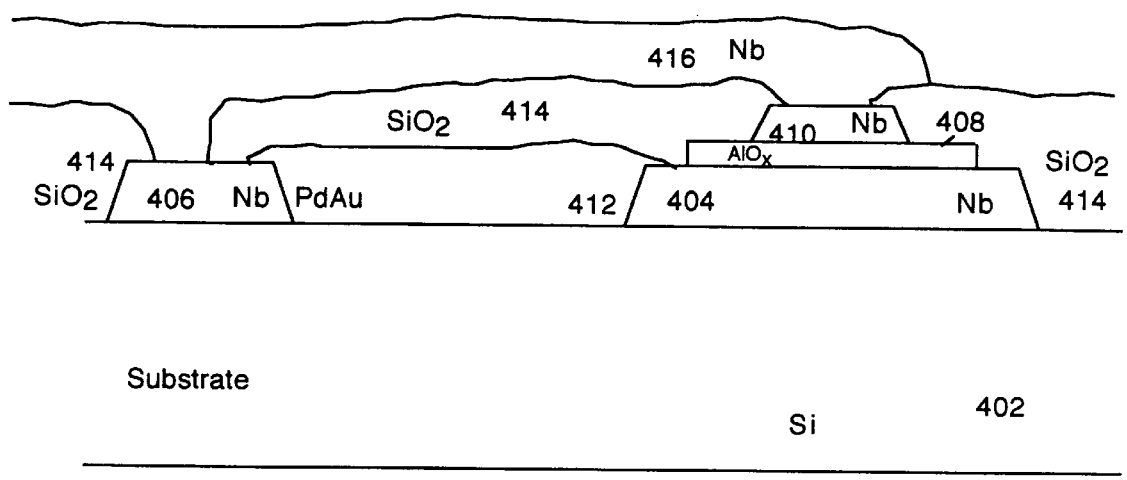
FIG. 7 shows a side view of the fabrication layers of the improved SQUID of FIG. 3.
Figure 8:
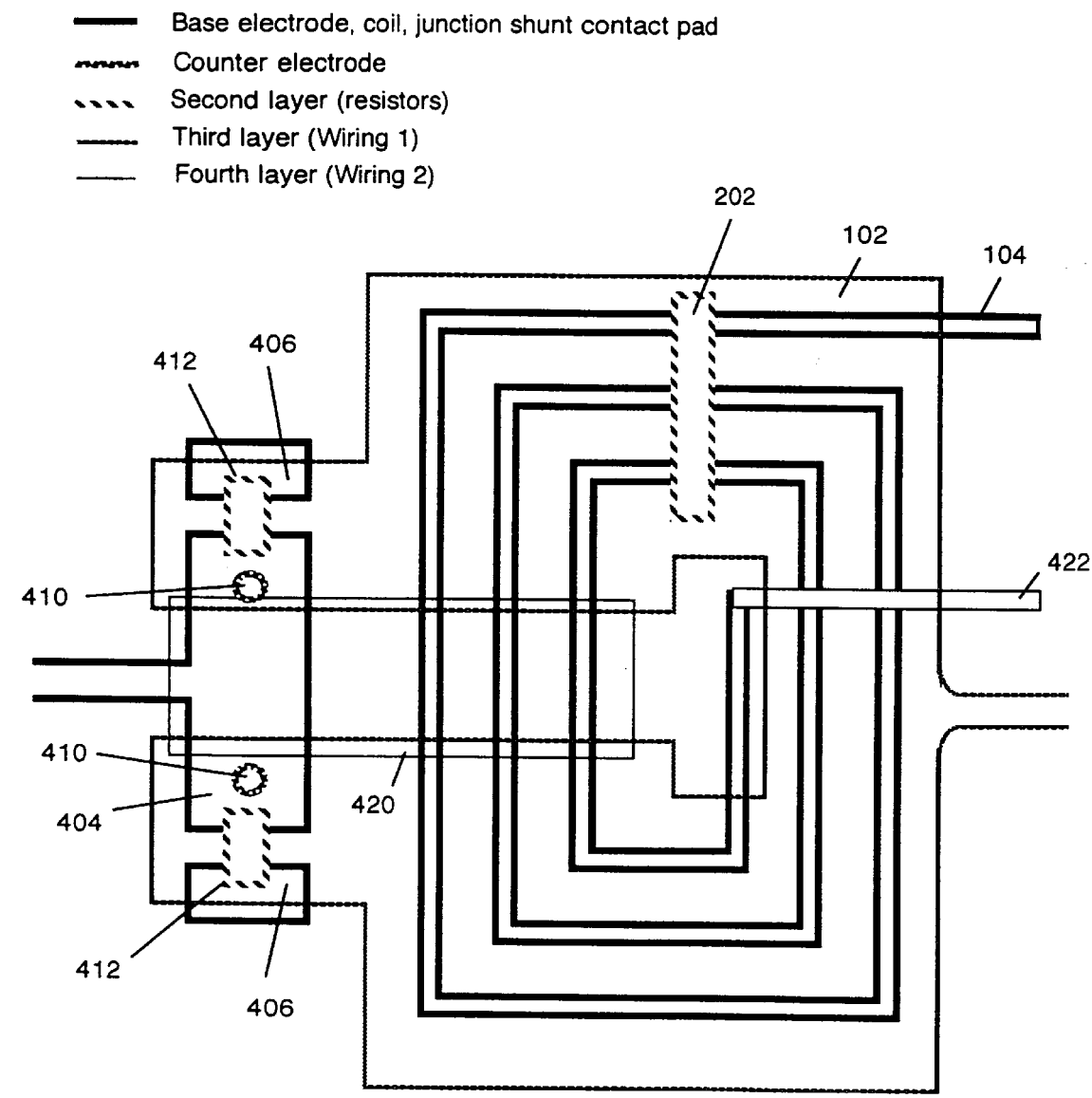
FIG. 8 shows a top view of the fabrication layers of the improved SQUID of FIG. 3.

Intracoil shunt 202 is an improvement over conventional coil damping methods for several reasons. First, the resistance of each resistor connecting the coil turns or loops can be made quite small to effectively damp the resonances. Since Johnson noise is related to the total series resistance of these small resistors making up shunt 202, it is still quite small. Second, coil resonances are more effectively removed with the design of the present invention than with conventional damping methods. The effectiveness of the current design is shown in FIGS. 5 and 6. Third, intracoil shunt 202 can be added to SQUID 200 very conveniently as it is fabricated. This is shown in FIGS. 7 and 8.

Figure 1:
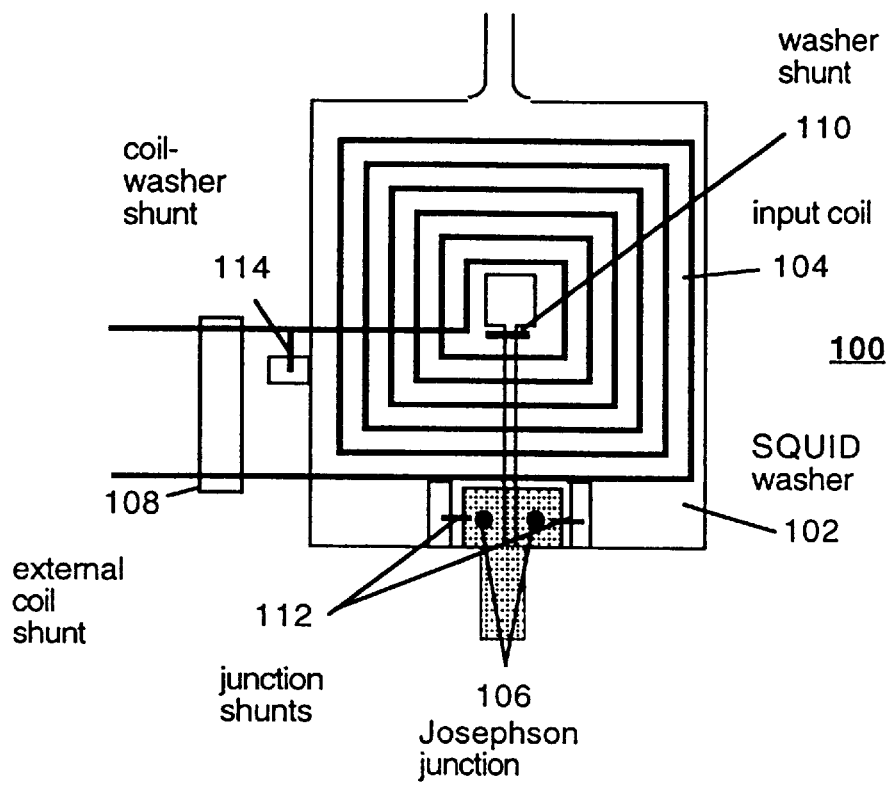
FIG. 1 shows a conventional planar geometry coupled dc superconducting quantum interference device (SQUID), with prior art damping techniques applied.
Figure 2:
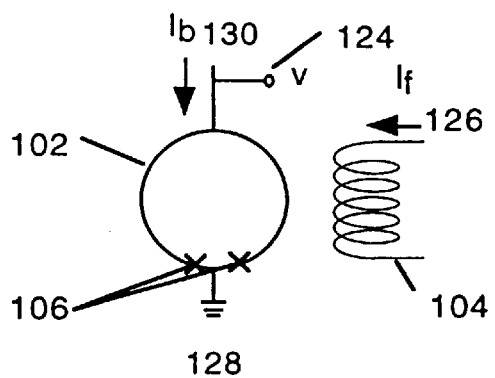
FIG. 2 shows a schematic diagram of the SQUID of FIG. 1.

FIG. 5 shows voltage-flux curves for the conventional SQUID 100 of FIGS. 1 and 2, and the improved SQUID 200 of FIGS. 3 and 4. Referring now to FIG. 2, voltage-flux curve 501 shows the voltage 124 measured across the SQUID for a given modulation current 126, at a bias current 130 just slightly above the SQUID critical current, for conventional SQUID 100.

Voltage-flux curve 502 shows the voltage 124 measured across the SQUID for a given modulation current 126, at a bias current 130 just slightly above the SQUID critical current, with intracoil shunt 202 added as shown in FIGS. 3 and 4.

Curve 502, showing the voltage-flux characteristics of the improved SQUID 200 of FIGS. 3 and 4, has a significantly improved transfer function compared to curve 501, showing the voltage-flux characteristics of the conventional SQUID 100 of FIGS. 1 and 2. Both curves show resonant characteristics, but curve 502 has a usably smooth portion, on the decreasing part of the curve. In addition, as the base current increases, resonance effects disappear entirely from improved SQUID 200 much faster than from conventional SQUID 100.

FIG. 6 shows the modeled impedance seen by junctions 106 at various frequencies in three SQUIDs having three different modes of damping coil resonances. The three curves are offset for clarity. Curve 601 shows the impedance with no coil damping of any sort. Curve 602 shows the impedance with external shunt 108 of FIG. 1. Curve 603 shows the impedance with intracoil shunt 202. The impedance with the external shunt is better than the impedance with no coil damping, but the impedance with the intracoil shunt is dramatically better than either.

Figure 9:
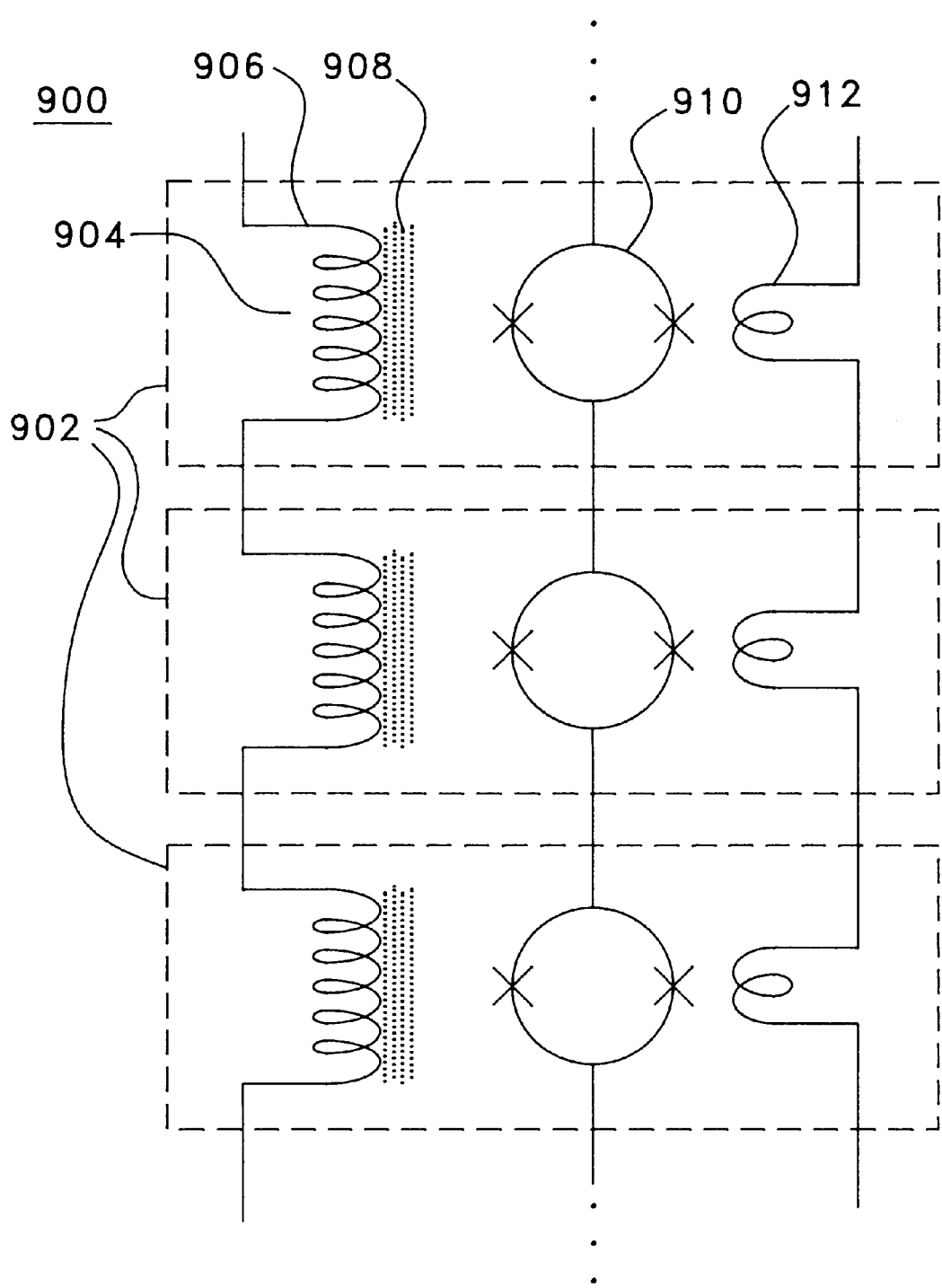
FIG. 9 shows an array of the improved SQUIDS of FIG. 3.

Moreover, the invention may be usefully applied to other systems as well, including series SQUID array amplifiers. Such a system is shown in FIG. 9.

FIG. 7 shows a side view of the first few fabrication layers of one Josephson junction of improved SQUID 200 of FIGS. 3 and 4. The SQUID circuit is fabricated on a silicon substrate 402. Trilayer Josephson junctions 106 are formed by depositing layers of superconductor niobium (Nb), insulator oxidized aluminum ($AlO_x$), and niobium, followed by patterning (commonly etching in a reactive gas) to form the structure shown in FIG. 7. Niobium layer 404 is the base electrode of the Josephson junction, and niobium layer 410 is the counter electrode. Aluminum oxide layer 408 is the tunneling barrier. Layer 406 is the junction shunt contact pad. The input coil 104 (shown in FIG. 8) is formed on substrate 402 from the base electrode niobium layer in the same patterning step as 404 and 406. Deposited palladium gold (PdAu) layer 412 forms junction shunt 112 of FIGS. 1 and 3, for damping the hysteresis in Josephson junction 106, as well as the intracoil shunt 202, shown in FIG. 8. Note that, in this preferred manufacturing process, no extra steps or layers are required by the present invention, as intracoil shunt 202 is deposited along with junction shunt 11 2, which is already used in conventional SQUIDs. The invention may, however, be deposited in a different resistive layer without affecting its utility.

Silicon dioxide $SiO_2$ 414 is deposited on top of this structure to separate the metal layers except where interconnects are needed, in which case holes are formed by etching. For example, holes are formed over niobium layers 406 and 410 to allow these structures to be connected by wiring 1 layer 416.

FIG. 8 shows a top view of the metallic layers of improved SQUID 200 of FIGS. 3 and 4. The substrate, the insulator layers, and layer 408 of Josephson Junctions 106 are not shown. The top niobium layer of the junctions (features 410) is formed in the first lithographic step. The bottommost layer is niobium and contains base electrode 404 and junction shunt contact pad 406 (the bottom niobium layer of the junctions) and 104 (the input coil). A layer of palladium-gold (PdAu) comprising all resistive elements (junction shunts 112 (412 in FIG. 8), washer shunt, not shown, and intracoil shunt 202) is deposited on top of this niobium layer. Above these layers is another niobium layer, wiring 1, from which the washer 102 is formed. A final layer of niobium, wiring 2, completes the SQUID circuit with slot cover 420 and coil return line 422.

FIG. 9 shows an array 900 of the improved SQUIDS of FIG. 3, implemented as a series SQUID array amplifier. Each series amplifier element 902 comprises an signal SQUID coil 906, damped by internal coil shunt 908, SQUID 910, and feedback coil 912. Signal coils 906 are connected in series, so a single signal current flows through the chain. This causes a voltage across each SQUID 910, resulting in a total output voltage across the SQUID chain that is approximately n times the voltage induced in each SQUID, where n is the number of SQUIDS in the chain. A small portion of the output voltage may be placed across a resistor (not shown) to generate a current which is sent through the chain of feedback coils 912. The current in feedback coils 912 is then used to modify the voltage in SQUIDS 910 in a controlled manner, in order to increase the linearity of the amplifier 900 by causing the SQUIDS to operate in a smoother region of their flux curve. This reduces the voltage across the SQUID chain slightly (and thus reduces the gain of the amplifier) but increases the linearity and usefulness of the amplifier.

Note that the feedback coils could also have damping elements placed across their coils, but this is not needed in single coil elements like those shown in FIG. 9.

Figure 10A:
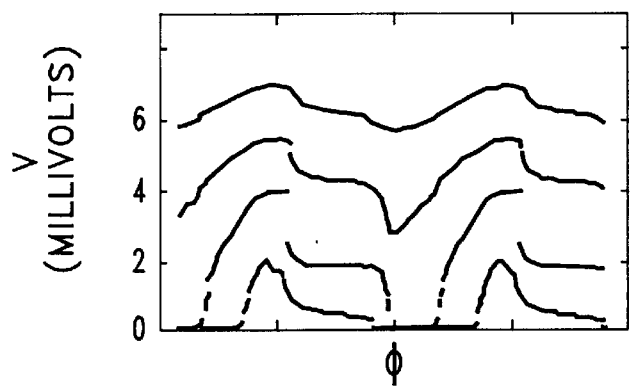
FIGS. 10A–10D shows plots of the performance of the array of FIG. 9 at various damping levels.
Figure 10B:
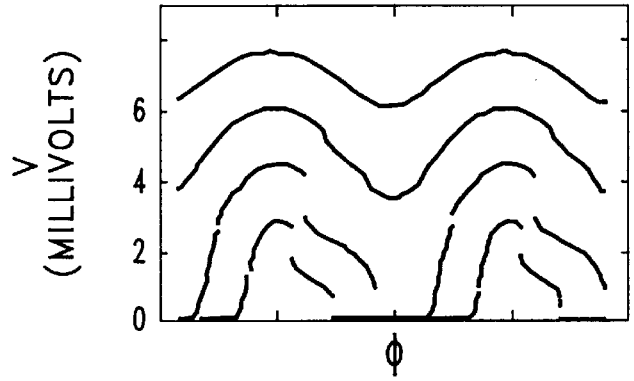
Figure 10C:
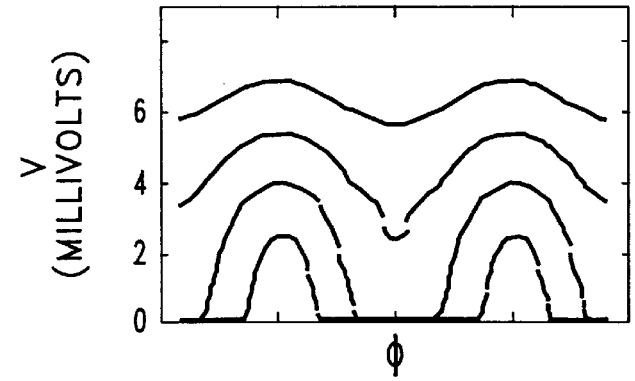
Figure 10D:
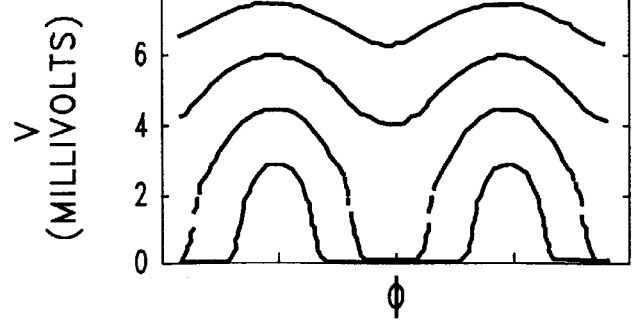

FIGS. 10A–10D shows voltage-flux plots illustrating the performance of array 900 at various damping levels (amounts of resistance in resistors 908). FIG. 10A shows the voltage-flux plot of array 900 when no resistors 908 are used (resistance of resistors 908 would be infinite, i.e., they are not used). FIG. 10B shows the voltage-flux plot of array 900 with a large amount of resistance, 1.9 ohms/turn (i.e. a small amount of damping) provided by resistors 908. FIG. 10C shows the voltage-flux plot of array 900 with a moderate amount of resistance, 0.75 ohms/turn (i.e. a moderate amount of damping) provided by resistors 908. FIG. 10D shows the voltage-flux plot of array 900 with a small amount of resistance, 0.08 ohms/turn (i.e. a large amount of damping) provided by resistors 908. The SQUID array bias current is 60 mA for the bottom curve on each plot, and 80, 100, and 120 for each successively higher curve on each plot. Note that the distortions in FIG. 10A (no damping) are severe, while the curves in FIG. 10D (a large amount of damping) are nearly ideal.

Figure 11:
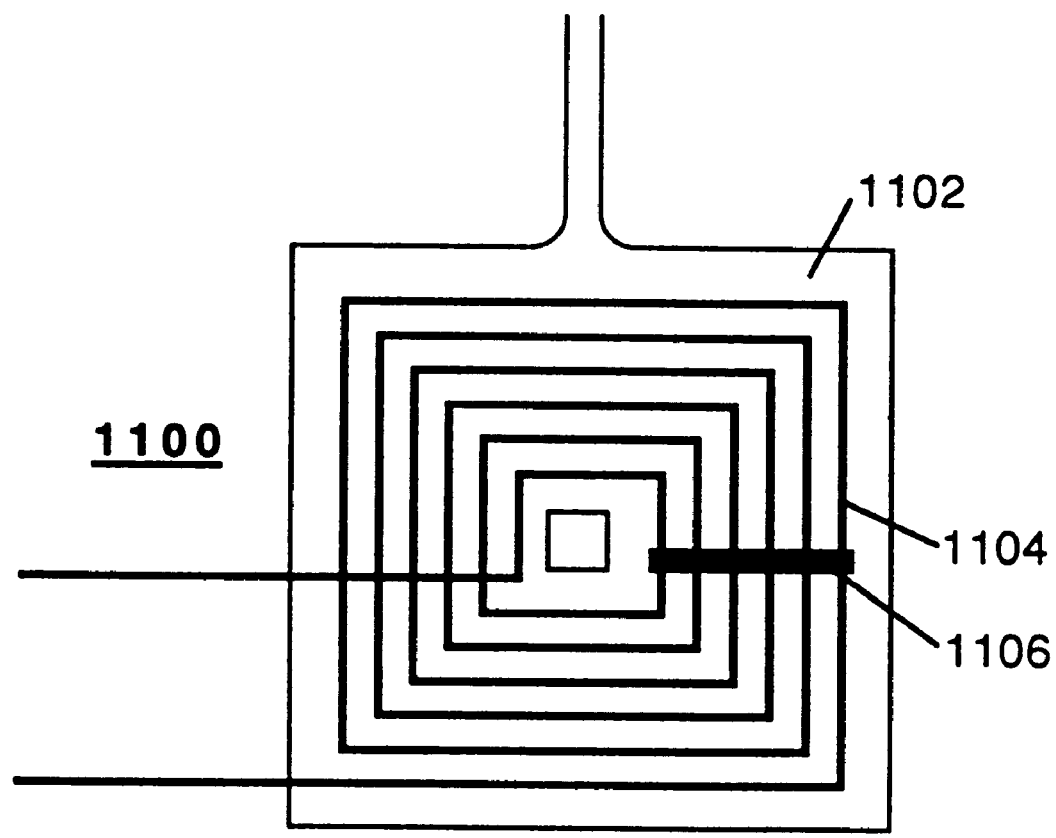
FIG. 11 shows a planar geometry superconducting coil in conjunction with a ground plane according to the present invention.

FIG. 11 shows a device 1100 comprising a planar geometry superconducting coil 1104 in conjunction with a ground plane 1102, and utilizing intracoil shunt 1106. Intracoil shunt 1106 damps resonances in coil 1104 by connecting the turns of coil 1104 with resistive elements. Coil 1104 may be used as an inductor, or as either a primary or secondary winding in a transformer, or in other application requiring a planar geometry superconducting coil used in conjunction with a ground plane.

Figure 12A:
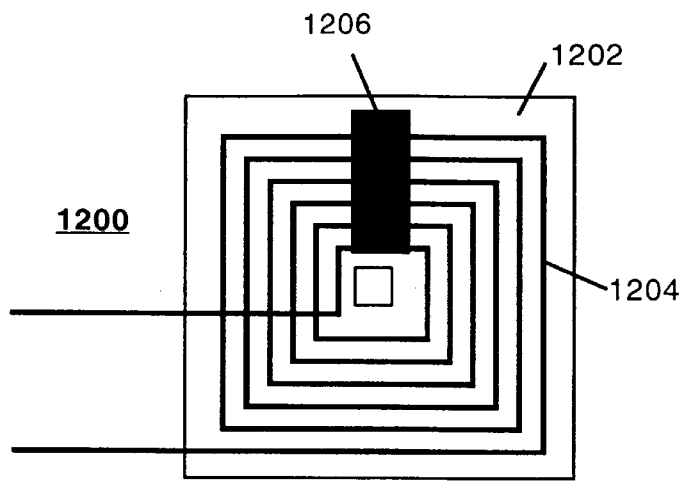
FIGS. 12A and 12B show two other embodiments of damped coils according to the present invention.
Figure 12B:
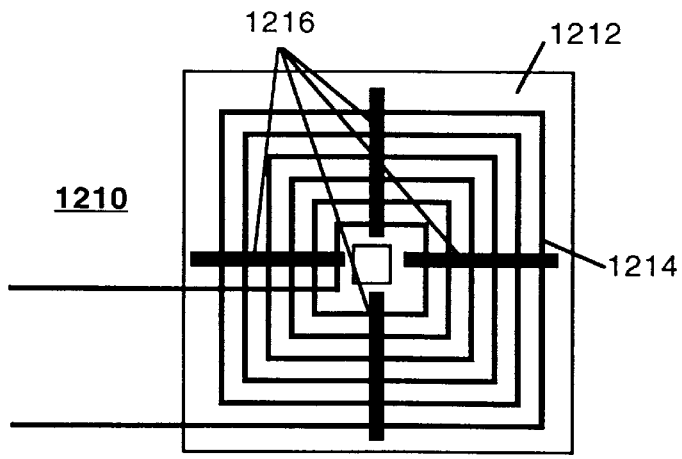

FIGS. 12A and 12B show two other embodiments of damped planar geometry superconducting coils 1204, 1214 in conjunction with ground plane 1202, 1212. These figures illustrate that resistive elements 1206, 1216 may have a variety of geometries or placements. FIG. 12A illustrates a large resistor 1206 placed radially across coils 1204. The width of resistor 1206 is one method of targeting the ohms/turn. Given a fixed resistor sheet thickness, resistor values are set by the length and width of the "bar" connecting two conductors. The resistance increases with increased length and decreases with increased thickness (the length is fixed in this application unless the resistor sheet is placed at an angle across the turns).

FIG. 12B illustrates a plurality of resistors placed radially across coils 1214 at various points. Those skilled in the art will appreciate that a wide variety of geometries and locations of resistors provides effective damping to planar geometry superconducting coils, including SQUIDS.

While the exemplary preferred embodiments of the present invention are described herein with particularity, those skilled in the art will appreciate various changes, additions, and applications other than those specifically mentioned, which are within the spirit of this invention.

What is claimed is:

1. Apparatus for damping resonances in a planar geometry multiturn superconducting coil comprising:
   an intracoil resistive shunt electrically connecting a plurality of turns of the coil with resistors, wherein the resistive shunt is substantially within the perimeter of the coil.

2. The apparatus of claim 1 wherein the shunt comprises a linear planar-film resistor.

3. The apparatus of claim 1 wherein the shunt comprises multiple linear planar-film resistors.

4. A damped superconductor coil comprising:
   a planar geometry multiturn superconducting coil; and
   an intracoil resistive shunt electrically connecting a plurality of turns of the coil with resistors, wherein the shunt is substantially within the perimeter of the coil.

5. The apparatus of claim 4, further including:
   an electrical ground plane parallel and proximate to the coil.

6. The apparatus of claim 5, wherein the electrical ground plane consists of a superconductive material and forms at least one hole which concentrates magnetic field lines from the coil to the hole.

7. The apparatus of claim 6, wherein the ground plane additionally forms a gap extending from the hole to the edge of the ground plane to admit changing magnetic flux.

8. The apparatus of claim 7 wherein the coil is a signal coil of a superconducting quantum interference device (SQUID).

9. The apparatus of claim 7 wherein the coil in a modulation coil of a superconducting quantum interference device (SQUID).

10. The apparatus of claim 7 wherein the coil is an inductor in an amplifier.

11. The apparatus of claim 7 wherein the coil is a winding in a transformer.

12. The apparatus of claim 4 wherein the shunt comprises a linear planar-film resistor.

13. The apparatus of claim 12 further including:
    an electrical ground plane parallel and proximate to the coil.

14. The apparatus of claim 13, wherein the electrical ground plane consists of a superconductive material and forms at least one hole which concentrates magnetic field lines from the coil to the hole.

15. The apparatus of claim 14, wherein the ground plane additionally forms a gap extending from the hole to the edge of the ground plane to admit changing magnetic flux.

16. The apparatus of claim 15 wherein the coil is a coil of a superconducting quantum interference device (SQUID).

17. The apparatus of claim 15 wherein the coil is an inductor in an amplifier.

18. The apparatus of claim 15 wherein the coil is a winding in a transformer.

19. The apparatus of claim 4 wherein the shunt comprises multiple linear planar-film resistors.

20. An improved superconducting quantum interference device (SQUID) of the type having a signal coupling coil and a feedback coupling coil, the improvement comprising:
    at least one of the signal coupling coil and the feedback coupling coil further includes an intracoil resistive shunt electrically connecting a plurality of turns of the coil with resistors, wherein the resistive shunt is substantially within the perimeter of the coil.

21. The apparatus of claim 20 wherein the shunt is a linear planar film resistor.

22. The apparatus of claim 20, further including a superconducting electrical ground plane parallel and proximate to the SQUID, the ground plane forming at least one hole for concentrating magnetic field lines from one of either the signal coupling coil or the feedback coupling coil to the hole.

23. The apparatus of claim 22, wherein the ground plane additionally forms a gap from the hole to the edge of the ground plane for admitting magnetic flux.

24. A method of damping resonances in a planar geometry multiturn superconducting coil comprising the steps of:

placing a plurality of resistors parallel and proximate to the coil;

and electrically connecting a plurality of turns of the coil internally with the resistors.

* * * * *